United States Patent [19]

Mussler et al.

[11] Patent Number: 4,837,705

[45] Date of Patent: Jun. 6, 1989

[54] METHOD FOR CALCULATING THE RATE OF FREQUENCY OF RANDOM EVENTS

[75] Inventors: James M. Mussler, Bethel Park; Jane P. Arnold, Pittsburgh, both of Pa.

[73] Assignee: Westinghouse Electric Corp., Pittsburgh, Pa.

[21] Appl. No.: 18,899

[22] Filed: Feb. 25, 1987

[51] Int. Cl.$^4$ .................... G01R 23/10; G01R 23/15
[52] U.S. Cl. ................... 364/484; 364/486; 324/78 Q; 377/10; 377/49
[58] Field of Search ............ 364/484, 486, 481, 480, 364/178; 324/78 Q, 78 R; 377/10, 49, 28

[56] References Cited

U.S. PATENT DOCUMENTS

| | | | |
|---|---|---|---|
| 2,754,056 | 7/1956 | Friedman | 364/484 |
| 2,828,468 | 3/1958 | Ball et al. | 364/484 |
| 2,951,202 | 8/1960 | Gordon | 364/484 |
| 3,909,599 | 9/1975 | Trott, Jr. et al. | 364/484 |
| 4,349,878 | 9/1982 | Grimm | 364/484 |
| 4,420,809 | 12/1983 | Pierce | 364/484 |
| 4,609,990 | 9/1986 | Sember et al. | 364/484 |
| 4,723,216 | 2/1988 | Premerlani | 364/484 |

Primary Examiner—Bruce Y. Arnold
Assistant Examiner—Terry S. Callaghan
Attorney, Agent, or Firm—R. P. Lenart

[57] ABSTRACT

A method of determining the rate of change of frequency of a plurality of randomly occurring events begins by counting the number of random events which occur within a plurality of predetermined sampling intervals to obtain a plurality of count values, each corresponding to one of the sampling intervals. These count values are stored in a memory table and the count values which correspond to the most recent set of N of the sampling intervals is summed to obtain a first accumulated count. A second accumulated count is obtained by summing the count values which correspond to a second set of N of the sampling intervals, preceding the most recent set. The rate of change of event frequency is then calculated by dividing the logarithm of $(S_1/S_2)$ by the number N. The value of the number N is dynamically adjusted for subsequent calculations based on the incoming frequency of random events.

6 Claims, 3 Drawing Sheets

METHOD FOR CALCULATING THE RATE OF FREQUENCY OF RANDOM EVENTS

BACKGROUND OF THE INVENTION

This invention relates to a method of determining the rate of change in frequency of random events and, more particularly, to such method when used to measure the rate of change of random neutron activity in nuclear reactors.

The frequency of a periodic signal is typically measured by counting the number of events (pulses, zero crossings, etc.) that have occurred over some fixed sample period, T. If C events are counted over this interval, the measured frequency of the signal, F, is simply calculated from the equation:

$$F = C/T$$

The rate of change in frequency can be calculated from two successive measurements of frequency $F_1$ and $F_2$ from the relationship:

$$\text{Rate} = (F_2 - F_1)/T$$

Graphically, the rate is depicted as the slope of a graph where a vertical axis, y-axis, is the number of events as a horizontal axis, x-axis, is the time. This equation works to calculate rate when the number of occurrences of the event is accurately known. But when the number of occurrences is varying statistically, inaccuracies result. For example, if an input from a source of random pulses has a Poisson distribution, the rate of change of mean frequency may be zero, but the observed rate of change may vary substantially for small numbers of counts per sample. The error in the measurement in slope can be reduced to an arbitrarily small value by increasing the length of the sample interval to a sufficiently large value or by averaging successive sample intervals to effectively increase the length of the sample interval. Thus it is apparent that averaging the inputs will produce a calculated rate that is much closer to the mean rate. This method works extremely well as long as a sufficient number of samples are used in the averages to offset the effects of randomness. At low levels of occurrences, this number is quite large and at high levels of occurrences, this number becomes substantially reduced. The exact number of readings needed to achieve a specified accuracy can be calculated using standard statistical methods. The response time of an instrument to the rate of change in the frequency of incoming pulses is directly related to the number of input samples used to calculate the pulse frequency. If N samples are used in this calculation, then the response time of the instrument will be between 2N and 2N+1 sample times. Therefore, accuracy and response time can be traded off in a straight forward manner.

Within a nuclear reactor, neutron activity is an indication of the power being generated by the reactor and an indication of the rate of change of neutron activity is important for both control and safety systems. With a very wide range of neutron activity, which may vary from a few pulses per second to millions of pulses per second, rather than measuring the linear rate of change of activity as described above, the measurement of exponential rate of change (typically in decades per minute) is more appropriate. The equation used for the exponential rate of change of neutron activity is given by $$\text{Rate} = (\log(F_2) - \log(F_1))/T$$

or $$\text{Rate} = (\log(F_2/F_1))/T$$

where $F_1$ and $F_2$ are two consecutive measurements of the frequency of neutron activity and T is the sample interval between the two frequency measurements. The resulting rate has units of decades per sample interval.

Instruments which measure neutron activity up to a few million pulses per second are commonly referred to as source range instruments. Such source range instruments, which are typically designed to cover a range of neutron activity from a few pulses per second to millions of pulses per second must meet specified response time criteria as well as specified accuracy and stability of measurement with respect to the measurement of the rate of change of frequency of neutron activity. To meet accuracy and stability requirements, the instrument must use a sufficiently long sampling interval so that variations in the reading due to the random nature of neutron activity are minimized. To meet response time requirements, the instrument must provide an accurate and stable reading in a timely fashion. The response time requirements generally vary over the operating range of the instrument from ten's of seconds at the low end to one second or less in the upper operating range. Different response times are also generally specified based on the type of input presented to the instrument. For example, response time requirements may be separately specified for exponentially increasing inputs and step change inputs. Therefore, the instrument may be required to distinguish between exponential changes in inputs and step changes in inputs. This feature is needed so that a small step change in input does not produce an indication of an abnormally high rate of change that may needlessly cause a trip in the reactor.

If a source range instrument continuously monitors neutron activity and stores the received number of counts for successive 100 ma intervals as count values $X_1, X_2, \ldots X_{16,640}$, where $X_1$ represents the number of counts received during the most recent 100 ma sample interval and $X_{16,640}$ represents the oldest sample, then an estimate of the mean value of frequency, or level L, is calculated from the equation:

$$L = 10(X_1 + \ldots + X_N)/N$$

where L has units of counts per second. The value of N is chosen to meet the specific accuracy, response time and statistical stability requirements of the source range instrument. In previous instruments, the exponential rate, R, was typically calculated from two successive values of L. For example, if:

$$L_1 = 10(X_1 + \ldots + X_N)/N$$

and $$L_2 = 10(X_2 + \ldots + X_{M+1})/M$$

that is, $L_1$ is the most recent calculation of level and $L_2$ is the next most recent calculation of level, then a common method of calculating the exponential rate, R, is to use the equation:

$$R = 600 \log (L_1/L_2)$$

where R has units of decades per minute.

This method can give acceptable results when N equals M, but this method is unsuitable where the number of samples used in the level calculation is dynamically changing to meet the various response time and accuracy requirements of the instrument. During exponential increases in the level, while N is changing, the consecutive sample periods in which N and M are not equal will cause the above calculation of rate to substantially overshoot the true value. This problem can be overcome by requiring that N equal M at all times for the purposes of the rate calculation. However, this method has additional problems. Since many terms used in the calculation of $L_1$ are common to the calculation of $L_2$, the two values are not statistically independent samples. This maximum overlap in terms causes the statistical fluctuations in the rate calculation to be considerably larger than if the calculation was done with statistically independent samples of the same number of terms. Furthermore, the number of terms used to provide the best estimate of level is not necessarily the optimum number used for the rate calculation.

It is therefore desired to provide an improved method of calculating the rate of change of frequency of random events which reduces statistical fluctuations in the calculated rate and readily distinguish between exponential changes in the inputs and step changes in the inputs.

SUMMARY OF THE INVENTION

This invention encompasses a method of determining the rate of change of frequency of a plurality of randomly occurring events wherein the number of the events which occur within a plurality of predetermined sampling intervals is counted to obtain a plurality of count values, each corresponding to one of the sampling intervals. These count values are stored in a memory table and the count values which correspond to the most recent of N of the sampling intervals are summed to obtain a first accumulated count, $S_1$. The count values which correspond to a second set of N of the sampling intervals preceding the most recent set, are summed to obtain a second accumulated count, $S_2$. The rate of change of event frequency is then calculated by dividing the logarithm of $(S_1/S_2)$, by the number N.

The value of N used in the rate calculation is dynamically adjusted in response to the measured frequency of events. If the measured frequency of events exceeds a predetermined threshold, and the frequency is determined to be increasing at an exponential rate, then the value of N is decreased by a preselected amount for successive rate calculations until the value of N reaches a preselected minimum or the calculated rate of change is less than a preselected exponential rate of change.

DESCRIPTION OF THE PREFERRED EMBODIMENT

Figure 1:
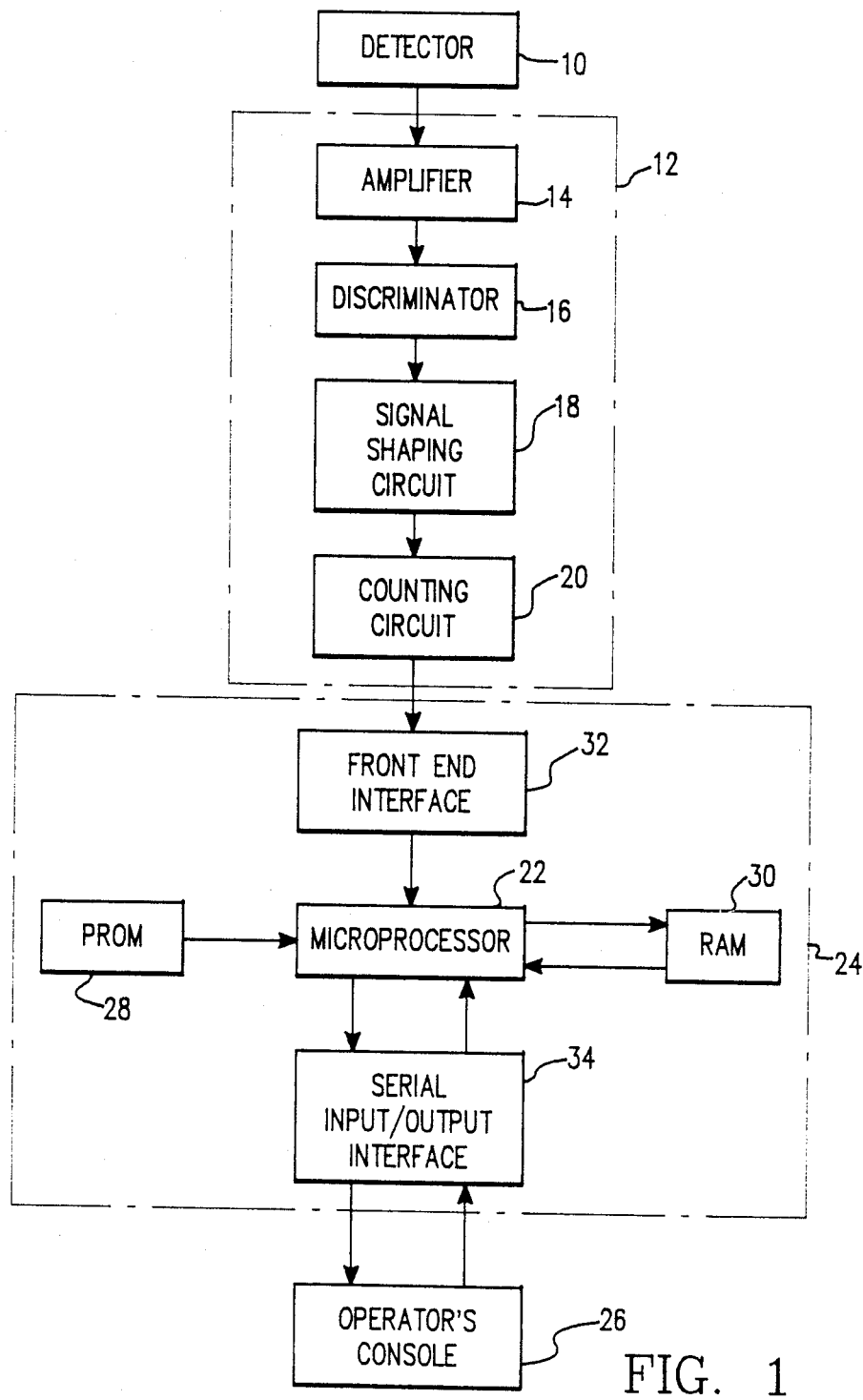
FIG. 1 is a block diagram of a source range instrument which may be used to perform the method of the present invention.

Referring to the drawings, FIG. 1 is a block diagram of a source range instrument which may be used to perform the method of the present invention. A suitable neutron detector 10 generates a pulse of current each time a neutron enters the detector and delivers this current pulse to the front end circuit 12 of the instrument. This front end circuit includes an amplifier 14, discriminator 16, signal shaping circuit 18, and counting circuit 20. The amplifier 14 amplifies the detector current and the discriminator compares the amplified current to a reference level and distinguishes between current pulses due to neutron acitivity and those pulses caused by external noise in the system. The pulses which pass the discriminator are then shaped by the signal shaping circuit 18 and passed to a counting circuit 20. The counting circuit counts pulses for a fixed period of, for example, 100 milliseconds and then interrupts a microprocessor 22 in the instrument microcomputer 24. The counting circuit is double buffered so that counting continues during the next sampling period while the microprocessor performs its tasks of determining the frequency of the incoming pulses and the rate of change of frequency of the incoming pulses and displays the results on an operator console 26. The microcomputer includes standard components such as an Intel 8086 microprocessor, and suitable programmable read-only memory 28 and random access memory 30. Suitable digital parallel and serial interface circuitry 32 and 34 provides communications between the processor, the front end circuit and the operator's console.

When the processor receives an interrupt signal from the front end counting circuit, the processor reads the total number of counts that occurred during the previous sampling interval. This sample count is stored in a table in memory that contains a historical record of the number of counts received during the last 16,640 sample periods. The large number of stored historical samples allows both the frequency of incoming pulses (the level) and the rate of change in frequency in incoming pulses (the rate) to be calculated by a novel adaptive method that dynamically adjusts the effective sampling period over which the level and rate are calculated.

The rate is calculated according to the equation:

$$R = (1/N)600 \log (S_1/S_2) \qquad (1)$$

where N is the number of terms used for each summation, $S_1$ is the sum of the last N historical terms (1 through N) and $S_2$ is the sum of the last N historical terms (N+1 through 2N). With a sample period of 100 milliseconds, R will have units of decades per minute.

Using standard methods of statistical analysis, it is possible to calculate the value of N in the above rate equation that will satisfy the system's specifications. For example, if the incoming pulses have a Poisson distribution, then the standard deviation of the rate, $\sigma$, is given by:

$$\sigma = \frac{600}{n \ln 10} \left[ \frac{1}{\Lambda_1} + \frac{1}{\Lambda_2} \right]^{\frac{1}{2}} \qquad (2)$$

where N is the number of terms used for each summation, $\Lambda_1$ is the mean number of counts of the last N historical terms (1 through N), and $\Lambda_2$ is the mean number of counts of the last N historical terms (N+1 through 2N). With a sample period of 100 milliseconds, $\sigma$ will have units of decades per minute.

If $\sigma$ represents the mean of the input over a 100 millisecond sampling period and if the input is held constant such that equals $N\lambda$, then the standard deviation, $\sigma$, becomes:

$$\sigma = \frac{600}{N \ln 10} \left(\frac{2}{N\lambda}\right)^{\frac{1}{2}} \quad (3)$$

Solving for N, the result is:

$$N = \frac{7.2 * 10^5}{\lambda (\sigma \ln 10)^2} ^{\frac{1}{3}} \quad (4)$$

From equation (4), a minimum number of samples needed to maintain the specified statistical stability can be easily determined. For example, if it is desired to have the statistical stability within accuracy specifications of 1.5 decades per minute 95% of the time (i.e. two standard deviations), then a value of 0.25 is used for $\sigma$ in the above equation.

Similarly the equation for the peak rate to a step response can be derived. The peak calculated rate will occur N samples after the step input occurs. If the constant input before the step had a mean value of $\lambda$ counts per 100 milliseconds sample, and the constant input after the input is $r\lambda$ counts per 100 milliseconds sample, then $\lambda_1$ equals $Nr\lambda$ and $\lambda_2$ equals $N\lambda$ and the standard deviation, $\sigma$, is:

$$\sigma = \frac{600}{n \ln 10} \left(\frac{r+1}{nr\lambda}\right)^{\frac{1}{2}} \quad (5)$$

and the peak rate, $R_p$ is:

$$R_p = \frac{600}{N} \log r \quad (6)$$

Therefore, to satisfy a peak rate specification within two standard deviations, the relationship $R_p + 2\sigma \leq K$ must be met, where K is the peak rate allowed. This equation does not have a closed form solution, but can be solved iteratively using standard numerical methods. The response time to an exponential input is simply 2N.

Figure 2:
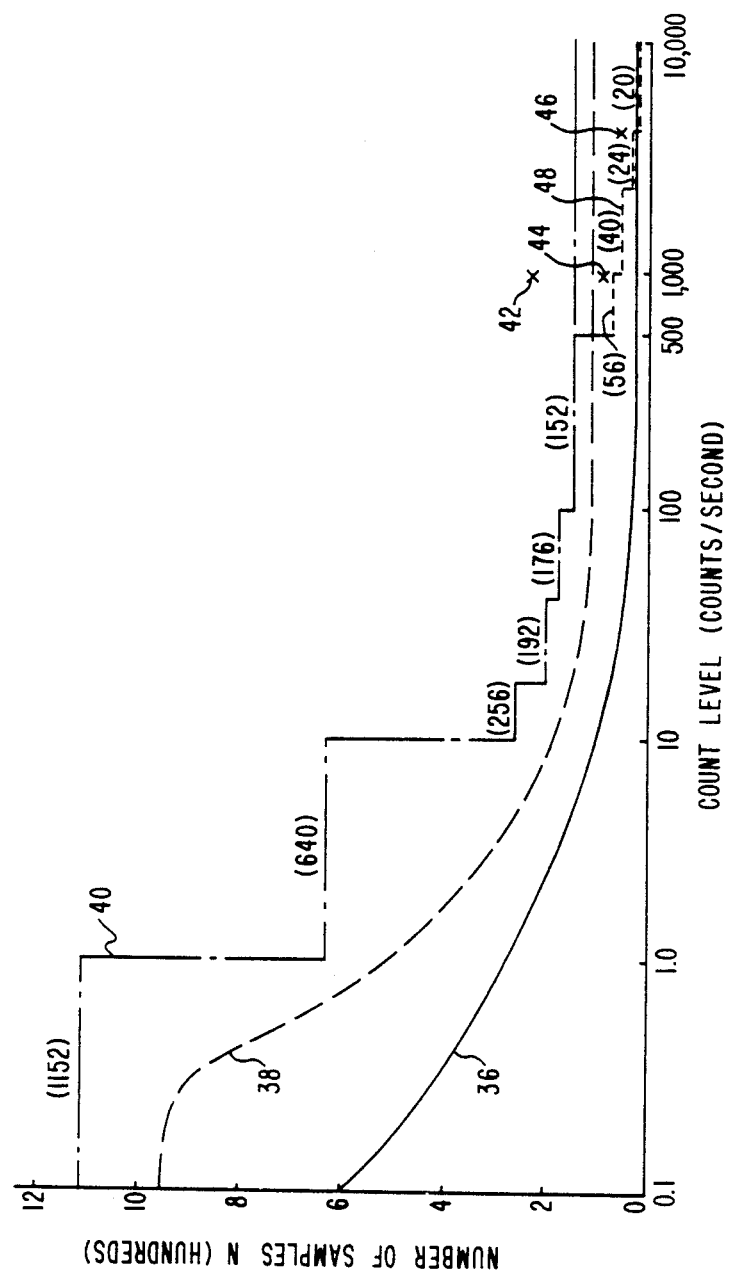
FIG. 2 is a series of curves which illustrate elements of the present invention.

The above calculation of N is based on a confidence interval of two standard deviations, so that the specifications will be met approximately 95% of the time. FIG. 2 is a graphical representation of the required system specifications. Curve 36 represents the minimum number of samples required versus count level to meet the two standard deviation requirement for normal statistical fluctuations. Curve 38 represents the number of samples fluctuations. Curve 38 represents the number of samples required versus count level for an allowable peak rate for a step input change. Any value of N above these curves will produce a result which is within specifications. Therefore, a break point curve 40 represents acceptable numbers of required samples versus count level for most applications. However, in some applications the desired response time requirements will fall below the line set by the peak rate allowed for a step input requirement. These response time requirements are illustrated by points 42, 44 and 46 in FIG. 2. Although the number of samples specified by curve 40 would meet the response time requirement set by point 42, it would not meet the response time requirements set by points 44 and 46. Therefore, any system which determines a value of N based solely on count level, cannot satisfy the response time requirements for an exponential input and a peak rate allowed for a step input.

To overcome this problem, a unique step input filter has been added to the source range instrument. Until the level of activity reaches 500 counts per second, this function is disabled and the value of N used in the rate calculation is based on the measured level as shown by the break point curve 40 in FIG. 2, labeled with the values (1152), (640), (256), etc. The break points in this curve are set to meet the worse case criteria of the system. In this system, these values are determined by the peak rate allowed for a step input.

Once the level of activity gets beyond 500 counts per second (or 50 counts per sample) the step input filter function is activated. The main components of this function include a fast rate calculator, an exponential input detector, and a time base slew limiter. The fast rate calculator calculates a rough estimate of the rate using equation 1 with N equals 10. This value is passed to the exponential input detector. If the exponential input detector calculates a rate greater than a predetermined threshold (for example, three decades per minute) then it will recheck the rate in 0.6 second increments. If after two additional checks the rate is still above the threshold, then at the next sample time, the change is declared to be exponential and the time base slew limiter is enabled.

The time base slew limiter is specifically designed to reduce the number of samples over which the rate calculation is performed, i.e. the value of N used in equation 1, and thus the effective time base over which the rate calculation is performed. It performs this function quickly enough to meet the time response specifications of the system and slowly enough to avoid large discontinuities in the rate calculations. When activated, the time base slew limiter decreases the number of samples used in each average by a predetermined number (for example six) for every sample period. This continues until the number of samples reaches a predetermined minimum allowed value or until the fast rate calculator detects a rate less than the threshold rate. This minimum is determined by the input level as shown by staircase curve 48 labeled (56), (40), (24) and (20). Once the rate falls below the threshold, the exponential input detector is disabled. It can be re-enabled only by repeating the entire enabling procedure. When the exponential input detector is disabled, the time base slew limiter increases the number of samples used in the rate calculation by one every other sample period until a normal mode value (N=152) is reached.

Figure 3:
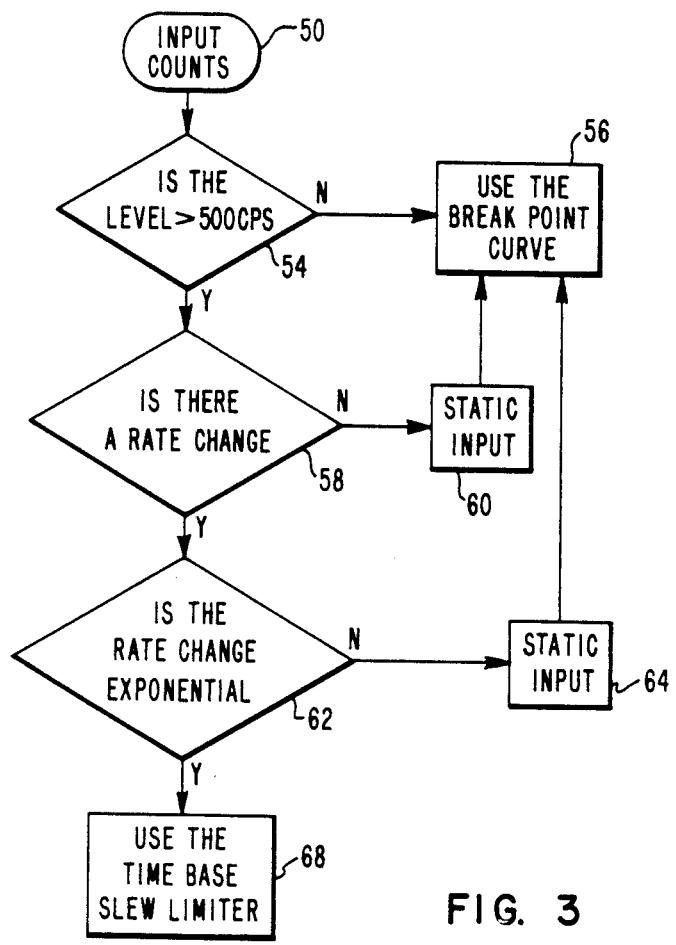
FIG. 3 is a flow diagram which illustrates a portion of the present invention.

FIG. 3 is a flow diagram which illustrates the operation of the step input filter function input. In block 50, the number of counts in the most recent sample interval is entered. Block 52 shows that this count level is then compared to a predetermined threshold, which is 500 counts per second in this example. If the level is less than this threshold, then the break point curve 40 in FIG. 2 is used in the subsequent rate calculations as illustrated by block 56. If the level does exceed the predetermined threshold, block 58 illustrates that a rate of change of frequency calculation is performed. If there is no rate change, the input is determined to be static as illustrated in block 60 and the break point curve 40 is used. If a rate change did occur, then block 62 shows that a determination is made as to whether or not this rate change is exponential. If it is not exponential, the input is again determined to be a static input as shown in block 64 and the break point curve 40 is used. If the rate of change is exponential, block 68 shows that the time base slew limiter function is enabled.

It should be understood that the step input filter function and its component parts, including the fast rate calculator, exponential input detector and time base slew limiter can be incorporated into the software used in the microcomputer 24 in FIG. 1. With the present invention, the instrument of FIG. 1 can be used to measure both the frequency and rate of change of frequency of random events with a different effective sampling time for the two measurements. The rate of change of frequency calculation can differentiate between exponentially increasing inputs and step inputs and dynamically adjust the effective sampling time of the instrument to improve response time and accuracy based on the type of input received.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A method of monitoring the rate of change of frequency of neutron activity in a nuclear reactor, said method comprising the steps of:
    generating a plurality of electric pulses in response to neutrons entering a neutron detector;
    counting the number of said pulses which occur within a plurality of predetermined sampling intervals, to obtain a plurality of count values, each corresponding to one of said sampling intervals;
    storing said count values in a memory table;
    summing said count values which correspond to a most recent set of N of said sampling intervals, to obtain a first accumulated count, $S_1$;
    summing said count values which correspond to a second set of N of said sampling intervals, preceding said most recent set, to obtain a second accumulated count, $S_2$;
    calculating the rate of change of event frequency by dividing the logarithm of $(S_1/S_2)$, by N; and
    displaying said rate of change of frequency.

2. The method of claim 1, further comprising the steps of:
    dynamically adjusting the value of N used in the calculating step, to produce an adjusted value of N; and
    using said adjusted value of N in a subsequent calculation of rate of change of frequency.

3. The method of claim 1, wherein said dynamically adjusting step comprises the steps of:
    measuring an initial frequency of said pulses, to obtain a measured frequency;
    comparing said measured frequency with a threshold frequency; and
    adjusting the value of N based on the result of the comparison of said measured frequency and said threshold frequency.

4. The method of claim 3, further comprising the steps of:
    comparing a calculated rate of change, based on a first value of N, with a predetermined threshold rate of change; and
    decreasing the value of N if the calculated rate of change exceeds the threshold rate of change.

5. The method of claim 4, wherein said calculating step is repeated and said decreasing step includes the steps of:
    reducing the value of N by a first preselected integral number prior to each calculation of rate of change, until either the value of N reaches a preselected minimum or the calculated rate of change is less than said predetermined threshold rate of change.

6. The method of claim 5, wherein following said decreasing step, if either the value of N has reached said preselected minimum or the calculated rate of change is less than said predetermined threshold rate of change, then said method further comprises the step of:
    incrementally increasing the value of N, for successive rate of change calculations, until N reaches a preset nominal value.

* * * * *